United States Patent [19]

Suguro

[11] Patent Number: 5,217,923
[45] Date of Patent: Jun. 8, 1993

[54] METHOD OF FABRICATING A SEMICONDUCTOR DEVICE HAVING SILICIDED SOURCE/DRAIN REGIONS

[75] Inventor: Kyoichi Suguro, Yokohama, Japan

[73] Assignee: Kabushiki Kaisha Toshiba, Kawasaki, Japan

[21] Appl. No.: 821,894

[22] Filed: Jan. 15, 1992

Related U.S. Application Data

[63] Continuation of Ser. No. 593,273, Oct. 1, 1990, abandoned, which is a continuation of Ser. No. 477,426, Feb. 9, 1990, abandoned.

[30] Foreign Application Priority Data

Feb. 13, 1989 [JP] Japan .................................. 1-31082
Jun. 22, 1989 [JP] Japan .................................. 1-160120

[51] Int. Cl.⁵ .................... H01L 21/336; H01L 21/28
[52] U.S. Cl. ...................... 437/200; 437/188; 437/192; 437/202; 437/931; 437/41; 437/44; 148/DIG. 147
[58] Field of Search ............. 437/40, 41, 57, 44, 437/34, 187, 188, 189, 192, 193, 196, 197, 199, 200, 202, 931; 357/23.4, 68; 148/DIG. 147

[56] References Cited

U.S. PATENT DOCUMENTS

| | | | |
|---|---|---|---|
| 4,492,971 | 1/1985 | Bean et al. ........................ | 437/175 |
| 4,663,191 | 5/1987 | Choi et al. ........................ | 437/200 |
| 4,669,176 | 6/1987 | Kato .................................. | 437/200 |
| 4,690,730 | 9/1987 | Tang et al. ........................ | 357/23.4 |
| 4,707,197 | 11/1987 | Hensel et al. .................... | 437/200 |
| 4,746,621 | 5/1988 | Thomas et al. .................. | 437/200 |
| 4,788,160 | 11/1988 | Havemann et al. .............. | 437/200 |
| 4,835,112 | 5/1989 | Pfiester et al. ................... | 437/200 |
| 4,855,798 | 8/1989 | Imamura et al. ................. | 437/200 |
| 4,927,783 | 5/1990 | Arai et al. ........................ | 437/199 |
| 5,010,032 | 4/1991 | Tang et al. ........................ | 437/57 |
| 5,059,554 | 10/1991 | Spinner et al. ................... | 437/200 |
| 5,081,066 | 1/1992 | Kim .................................. | 437/200 |

OTHER PUBLICATIONS

Lebowitz et al., "Latchup Suppression in Silicided Source/Drain/Gate CMOS by Formation of Modified Schottky P-Channels", VLSI Symposium 1988, pp. 53-54.
Ghandi, VLSI Fabrication Principles, John Wiley & Sons, 1983, pp. 435-437.
Wolf et al., Silicon Processing for the VLSI Era, vol. 1-Process Technology, Lattice Press, 1986, pp. 175-180.
Morarka, "Refractory Silicides for Integrated Circuits," J. Vac. Sci. Technol., vol. 17, No. 4, Jul./Aug. 1980, pp. 775-792.

Primary Examiner—Mary Wilczewski
Attorney, Agent, or Firm—Oblon, Spivak, McClelland, Maier & Neustadt

[57] ABSTRACT

A source/drain region of a MOS FET having a silicon substrate is covered with a metal silicide alloy layer. A silicon deposition layer is formed between the substrate and the silicide layer. The conductivity type of the deposition layer is different from that of the substrate, and the deposition layer per se functions as an impurity diffusion layer as the source/drain region or intervenes between the alloy layer and the impurity diffusion layer. The impurity diffusion layer, or the source/drain region, is formed in a shallow region in the substrate.

15 Claims, 11 Drawing Sheets

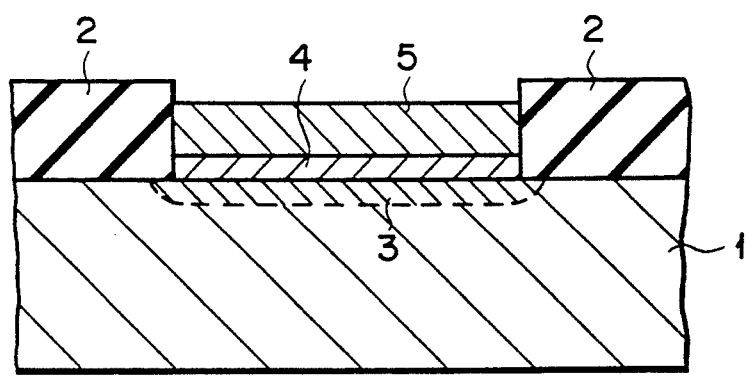
F I G. 8

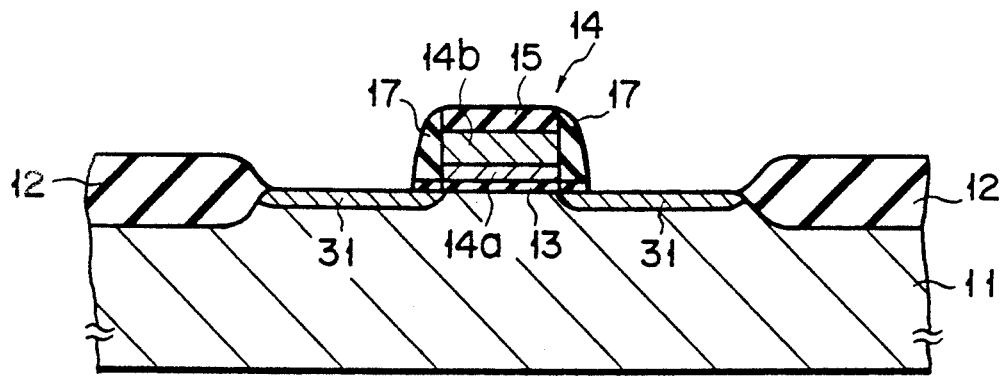
F I G. 3A
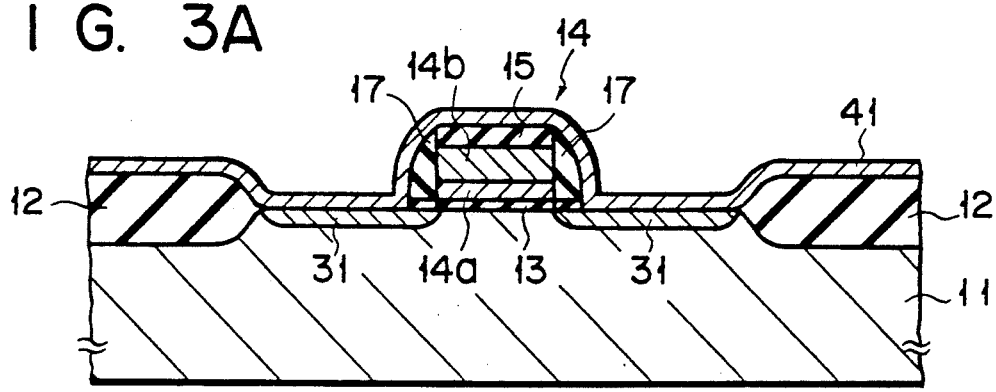
F I G. 3B
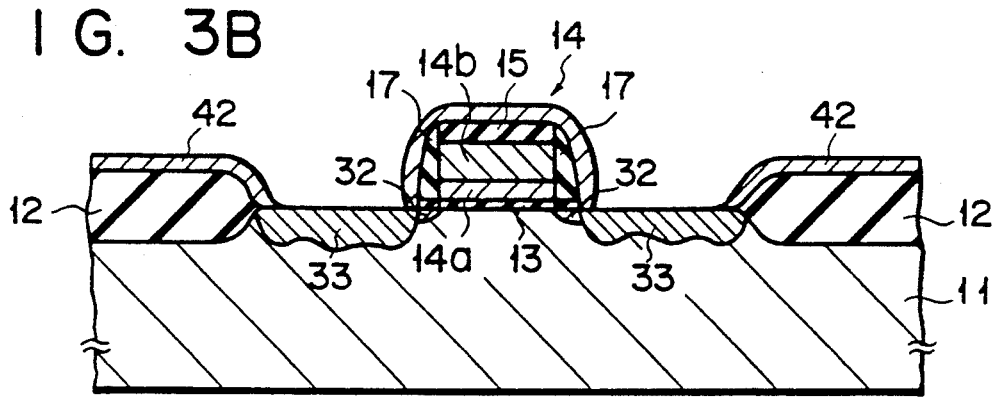
F I G. 3C
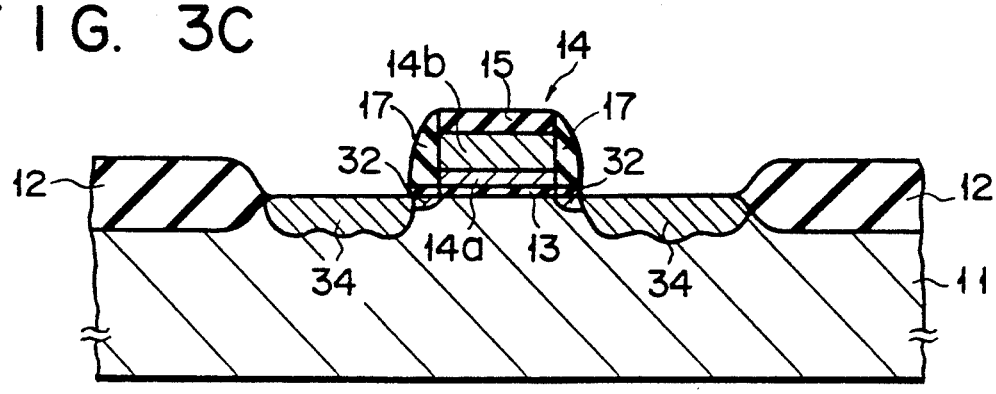
F I G. 3D

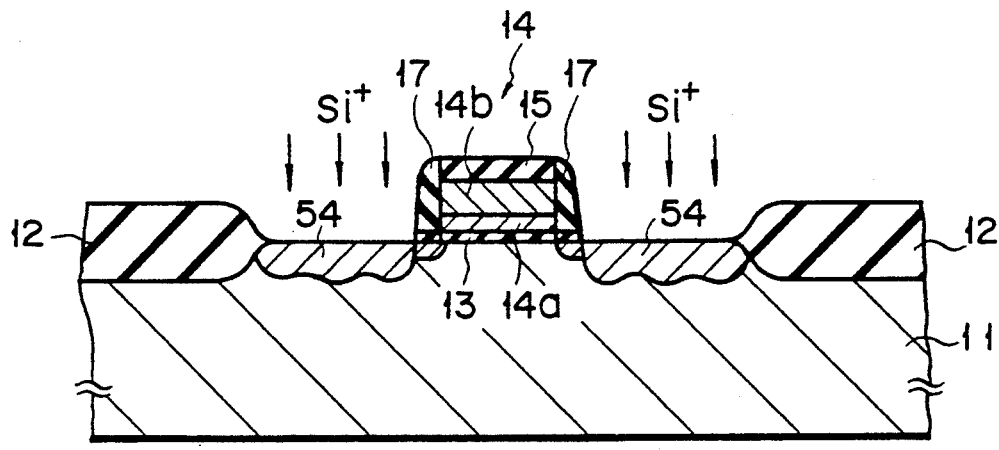
F I G. 5A
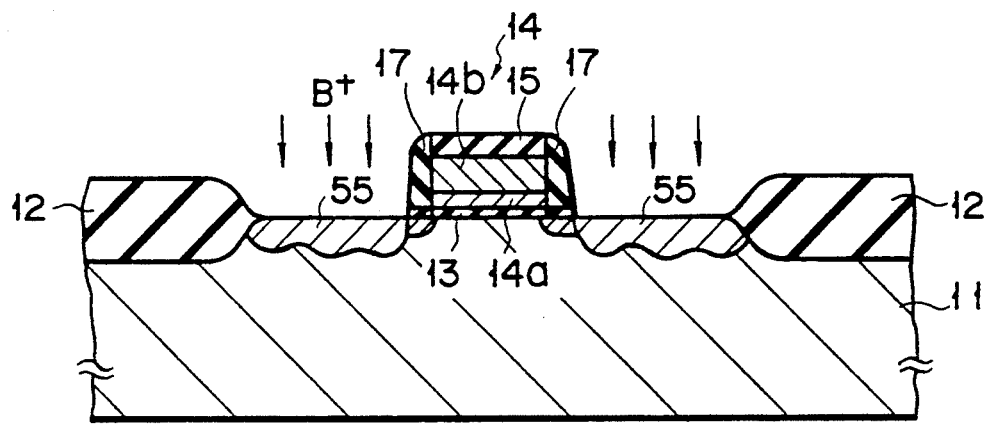
F I G. 5B
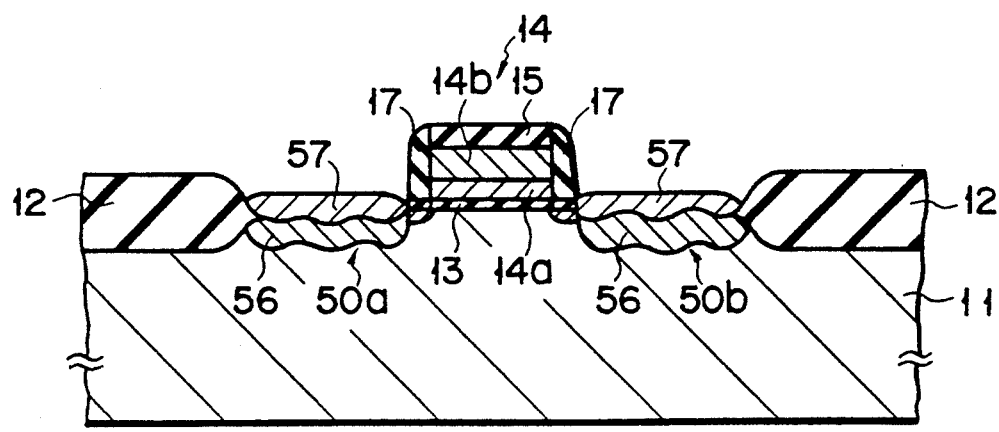
F I G. 5C

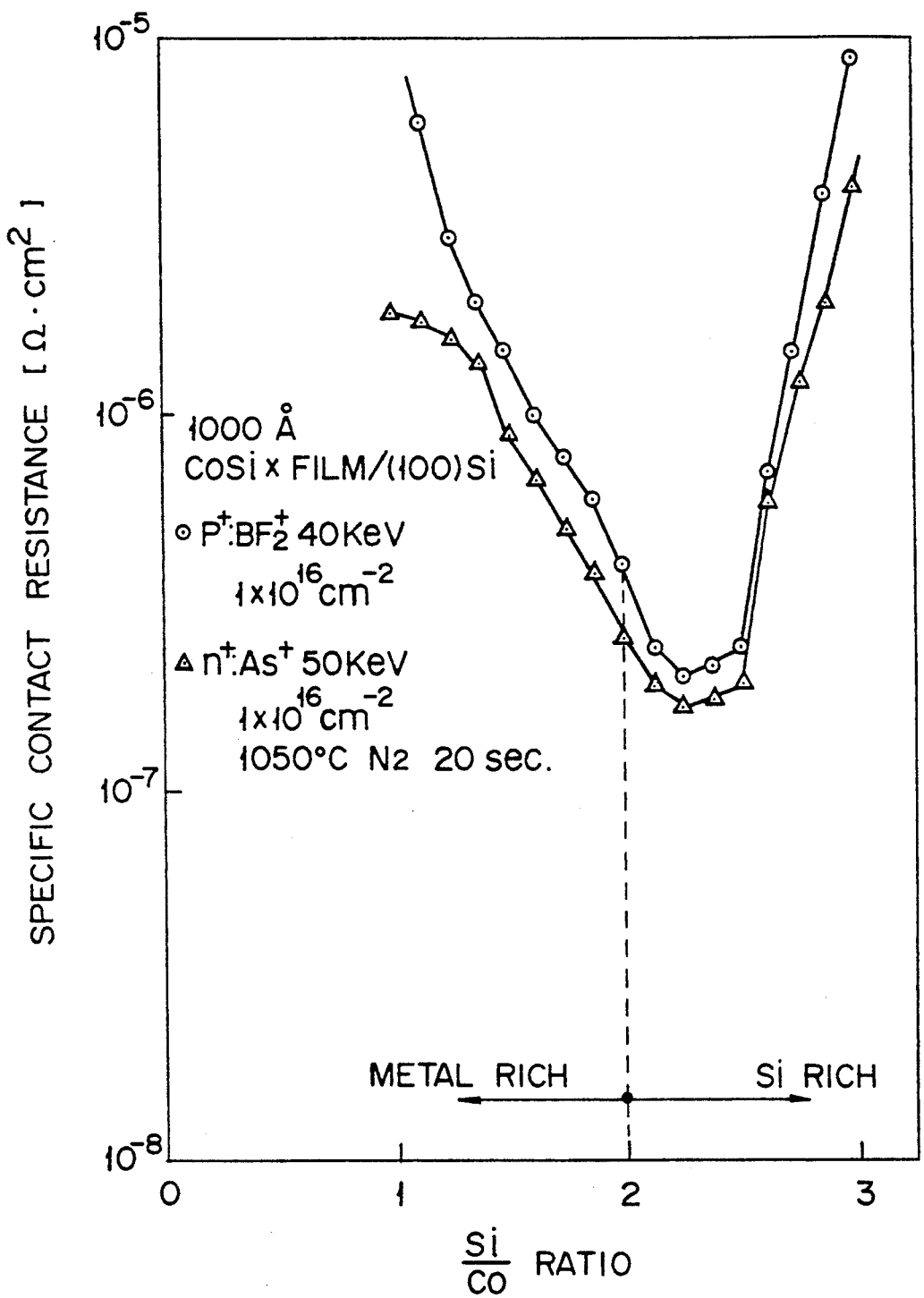
F I G. 7A

METHOD OF FABRICATING A SEMICONDUCTOR DEVICE HAVING SILICIDED SOURCE/DRAIN REGIONS

This application is a continuation of application Ser. No. 07/593,273 filed on Oct. 1, 1990 which was a continuation of U.S. application Ser. No. 07/477,426 filed on Feb. 9, 1990 now both abandoned.

BACKGROUND OF THE INVENTION

1. Field of the Invention

The present invention relates to a semiconductor device having an impurity diffusion layer of a second conductivity type formed in a shallow region within a semiconductor layer of a first conductivity type.

2. Description of the Related Art

In recent times, electronic devices such as computers and communication equipment have been employing as their key circuit components large scale integrated circuits (LSI) in which a number of circuit elements, such as transistors and resistors, are integrated into a semiconductor substrate. In this technical field, the problem of how to increase the integration density of an LSI is one of the most important currently being faced. To increase the integration density, it is necessary to further reduce the size of each circuit element, such as a MOS type field effect transistor (FET). One approach to realizing this has been to reduce the FET gate length, since a reduced gate length leads to a reduction in the total chip area occupied by FETs. However, the threshold voltage of the FET must be kept unchanged even if the gate length is reduced. To this end, a shallow source/drain region must be formed in the semiconductor substrate.

Low acceleration ion implantation has hitherto been the dominant method employed for forming the diffusion layer of a MOS FET. Recently, however, a diffusion process using an impurity—for example, As (arsenic)—has also been used for this purpose. This process succeeds in realizing a shallow source/drain region of about 0.1 $\mu$m in depth for the n+/p junction. The resultant MOS FET is reduced in size and high in performance. As for the p+/n junction, after the surface layer of the single-crystal silicon has been made amorphous by Si+, Ge+, Sn+ ion implantation, it is subjected to a low acceleration $BF_2$ implantation. This process realizes a shallow source/drain region of approximately 0.1 $\mu$m in depth even after annealing for activation has been carried out.

A diffusion layer about 0.1 $\mu$m deep has a high resistance and its sheet resistance is 100 ohms/□ or more. However, to increase the operation speed of the semiconductor element, the diffusion layer surface must be metallized to reduce its resistance.

Recently, an attempt has been made to form a metal silicide on a diffusion layer. In the process, an impurity diffusion layer is formed in an silicon exposed region, Ti (titanium) or Co (cobalt) is deposited over the entire surface of the substrate, titanium silicide or cobalt silicide is formed only on the silicon layer into which an impurity has been diffused by ramp annealing, and an unreactive Ti or Co film is etched away. When a silicide of 50 nm in depth, for example, is formed by this process, the sheet resistance is reduced to 3 to 5 ohms/□.

A conventional method of manufacturing MOS FETs by using a metal silicide will be described below, with reference to FIGS. 1A to 1D.

To start with, a field oxide film 12 is formed in an n-type Si substrate 11. A multilayer consisting of a gate oxide film 13 of 100 Å, a polysilicon layer 14a of 1000 Å doped with As, a tungsten silicide layer 14b of 3000 Å, and an $SiO_2$ film 15 of 1500 Å is shaped like a gate-electrode, by use of an etching process, within a region of the substrate enclosed by the oxide film 12. Thereafter, the side wall of the gate electrode portion is covered with an $SiO_2$ film 17. Cobalt is deposited over the entire surface of the structure, to form a Co film 19 of 300 Å thickness. The resultant structure is annealed in argon gas to form a CoSi layer of 700 Å, and is then immersed in a liquid composed of a mixture of hydrogen peroxide and hydrochloric acid, to remove the unreactive Co film 19. Thereafter, the structure is annealed in Ar gas, to form a $CoSi_2$ layer 20 of 1000 Å thickness, as shown in FIG. 1B.

As shown in FIG. 1C, B+ ions are implanted into the structure, over its entire surface and under the conditions of 10 KeV of acceleration voltage and $5\times10^{15}$ $cm^{-2}$ of dosage. As a result, the $CoSi_2$ layer 20 is doped with boron. Then, the structure is annealed at 850° C. and for 30 minutes in Ar gas, so that the boron is thermally diffused under the $CoSi_2$ layer 20, to form a p+ layer 16 i.e., a source/drain region, about 0.1 $\mu$m thick. Subsequently, interlayer insulation film deposition, contact hole opening, and interconnection wiring are successively performed, to complete the MOS FET. In this way, a p+ diffusion layer 0.1 $\mu$m thick and covered with a $CoSi_2$ layer 0.1 $\mu$m thick (of 1.5 ohms/□) is formed.

However, the process set out above has the following drawbacks.

As described above, after the $CoSi_2$ layer 20 is formed, boron is thermally diffused into the substrate 11 thereunder, as a diffusion source of the layer 20, thereby to form the p+ layer 16. Therefore, the layer 16 is necessarily deeper than the $CoSi_2$ layer 20. Since the depth of the source/drain region is equal to the sum of the thickness of the layer 20 and that of the layer 16, the depth of the source/drain region is therefore substantial.

When a native oxide film of the Si surface and a surface contaminated and damaged layer resulting from the dry etching are both present, it is difficult for the silicide to react uniformly. Therefore, if an impurity is later doped into the structure, the boundary structure will be nonuniform, as shown in FIG. 2. In the nonuniform boundary structure, local concentrations of electric fields tend to occur. At the locations or the pn junctions where the electric field is concentrated, the leakage current increases, and in an extreme case, the pn junction is destroyed. For this reason, when the above-described process is used, it is very difficult to form the pn junction of 0.1 $\mu$m or less deep.

In the case of the micro-transistors under the design rule of 0.3 $\mu$m or less, the total thickness must be 0.1 $\mu$m or less. To reduce the total thickness, it is necessary to reduce the thickness of the silicide and further to form a diffusion layer of several hundreds Angstroms under the silicide. However, if the silicide is thinned, resistance of the source/drain region increases. When the thickness of the diffusion layer is 500 Å or less, the pn junction characteristic is deteriorated. The causes for the junction deterioration are: 1) A GR (Generation Recombination) center distribution due to the metal distribution influences the junction characteristic so that the diffusion layer is within the thickness where the junction current leakage is observed; 2) When the diffusion layer is thinned, the configuration of the diffusion layer clearly reflects the irregularity of the silicide/Si interface, and accordingly, the electric field concentration tends to occur; 3) The ballistic conduction tends to occur.

SUMMARY OF THE INVENTION

Accordingly, an object of the present invention is to provide a semiconductor device in which an impurity diffusion layer of a second conductivity type is formed in a shallow region within a semiconductor layer of a first conductivity type.

Another object of the present invention is to provide a semiconductor device with such a structure suitable for the resistance reduction.

To achieve the above objects, there is provided a semiconductor device in which a deposition layer of the second conductivity type is interposed between a first semiconductor layer of the first conductivity type and an alloy layer consisting of a main component of the first semiconductor layer and a metal, the deposition layer being made of the main component of the first semiconductor layer.

In the specification, the term "deposition" should be understood in a broad sense, and involves epitaxial growth and precipitation.

According to one aspect of the invention, the alloy layer has been formed by first forming a layer which is rich in the main component of the first semiconductor layer and contains an impurity of the second conductivity type, and by then heating the layer thus formed, thereby depositing, between the first semiconductor layer and the layer thus formed, the deposition layer containing the impurity of the second conductivity type.

With this arrangement, the bottom of the deposition layer is in substantially the same level of the bottom of the alloy layer first formed. When the semiconductor component is added to the alloy, the resultant alloy layer is upheaved from the first formed alloy layer. Therefore, the sum of the resultant alloy layer and the deposition layer is thick enough to provide a low resistance.

In the first arrangement in which the semiconductor device is a MOS FET, the first semiconductor layer is a substrate, and the deposition layer forms major portions of source and drain regions.

According to another aspect of the invention, the device further comprises an impurity diffusion layer of the second conductivity type formed on surface of the first semiconductor layer, and in which the deposition layer has been epitaxially grown on the impurity diffusion layer, and the alloy layer is self-aligned with the deposition layer, eroding the upper surface of the deposition layer.

With such an arrangement, the alloy layer is formed by alloying the upper part of the deposition layer grown on the first semiconductor layer. Accordingly, the lower surface of the alloy layer is essentially higher than the surface of the first semiconductor layer. This implies that there is no erosion toward the first semiconductor layer. Therefore, the impurity diffusion layer may be formed in a shallow region under the alloy layer of low resistance. The shallowness and the low resistance of the source/drain region are both realized successfully.

In the second arrangement in which the semiconductor device is a MOS FET, the first semiconductor layer is a substrate, and the impurity diffusion layer and the deposition layer form a source/drain regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIGS. 3A through 3G are sectional views showing a sequence of process steps to manufacture a semiconductor device according to a first embodiment of the present invention;

FIGS. 5A through 5C are sectional views showing a sequence of process steps to manufacture a semiconductor device according to a second embodiment of the present invention;

FIGS. 7A and 7B are graphs respectively showing a variation of specific contact resistance against Si/Co ratios and a variation of specific contact resistance against Si/Ni ratios;

FIG. 8 is a sectional view showing a model of each of semiconductor devices according to fourth and fifth embodiments of the present invention;

DETAILED DESCRIPTION OF THE PREFERRED EMBODIMENTS

Figure 1A:
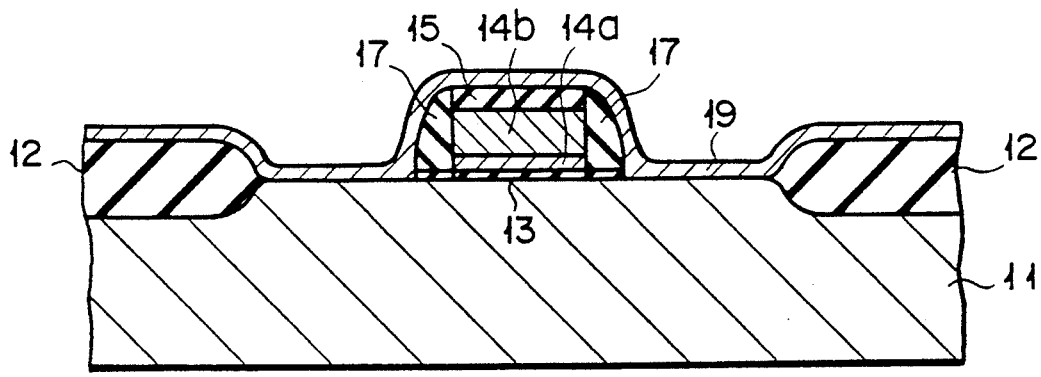
FIGS. 1A through 1D are sectional views showing a sequence of process steps to manufacture a semiconductor device of prior art.
Figure 1B:
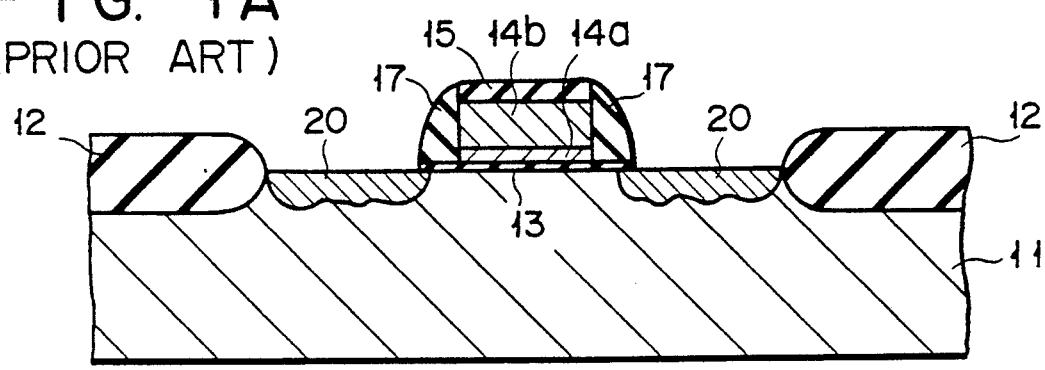
Figure 1C:
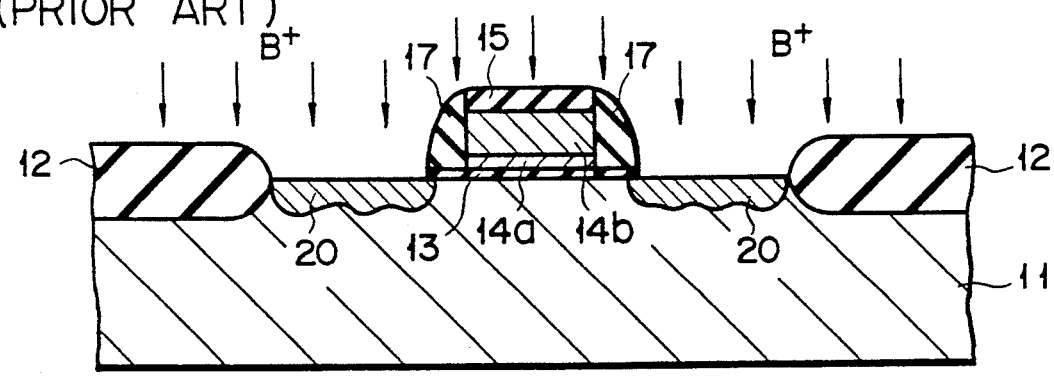
Figure 1D:
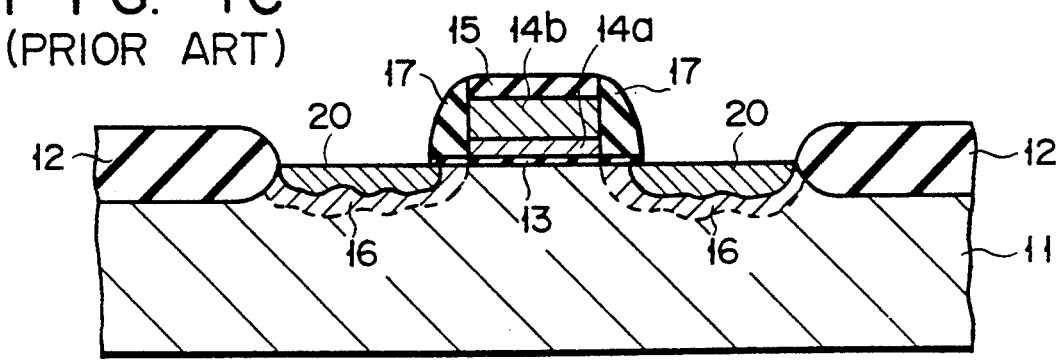
Figure 2:
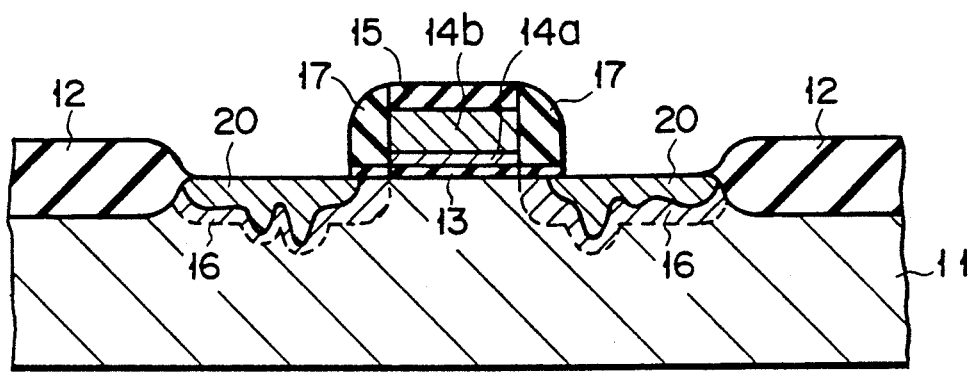
FIG. 2 is a sectional view showing the structure of the prior semiconductor device.

FIGS. 3A through 3G are sectional views showing a sequence of process steps to manufacture a semiconductor device according to a first embodiment of the present invention.

To start with, a field oxide film 12 of 0.6 $\mu$m thickness is formed on a semiconductor substrate, e.g., an n-type silicon substrate 11 whose specific resistance is 5 ohms cm and major face is set at <100> of face orientation, by thermal oxidation process. Within a region of the substrate surrounded by this film, a gate oxide film 13 of 100 Å thickness, a doped polycrystalline silicon layer 14a, a tungsten silicide ($WSi_{2.5}$) film 14b formed by a DC magnetron sputtering method or by an LPCVD method with a gas mixture of $SiH_4$ and $WF_6$, and a CVD - $SiO_2$ film 15 of 500 Å thickness are successively layered in this order, and then the multilayer is shaped like a gate by etching process.

Then, by using the multilayer, and the field $SiO_2$ film 12 as a mask, Ge (germanium) ions are implanted into the substrate 11 under the conditions of 30 keV of acceleration voltage and $5\times10^{14}$ cm$^{-2}$ of dosage, and BF$_2$ ions are implanted into the same under the conditions of 10 keV of acceleration voltage and $1\times10^{14}$ cm$^{-2}$ of dosage, thereby to form an impurity dope layer 31 of 500 Å thickness. Then, an SiO$_2$ film 17 of 0.1 μm thickness is formed over the side wall of the gate-like multilayer (FIG. 3A).

Pd (palladium) of 1000 Å thickness is deposited over the entire surface of the structure by the DC magnetron sputtering method (FIG. 3B).

Further, the structure is annealed at 200° C. for 30 minutes, to form a Pd$_2$Si layer 33 of 1400 Å. A layer denoted as 42 is the Pd layer which did not react and is left (FIG. 3C).

Thereafter, this unreactive Pd layer 42 is removed by a KI+I$_2$ solution. Then the structure is annealed at 730° C. or more, for example, 750° C., for 30 minutes to convert the Pd$_2$Si layer 33 into a PdSi layer 34 i.e., a silicon rich film, by phase transforming. In this case, the substrate 11 is slightly eaten, so that the bottom of the PdSi layer 34 becomes slightly deeper in the range of 500 to 600 Å (FIG. 3D).

Figure 3E:
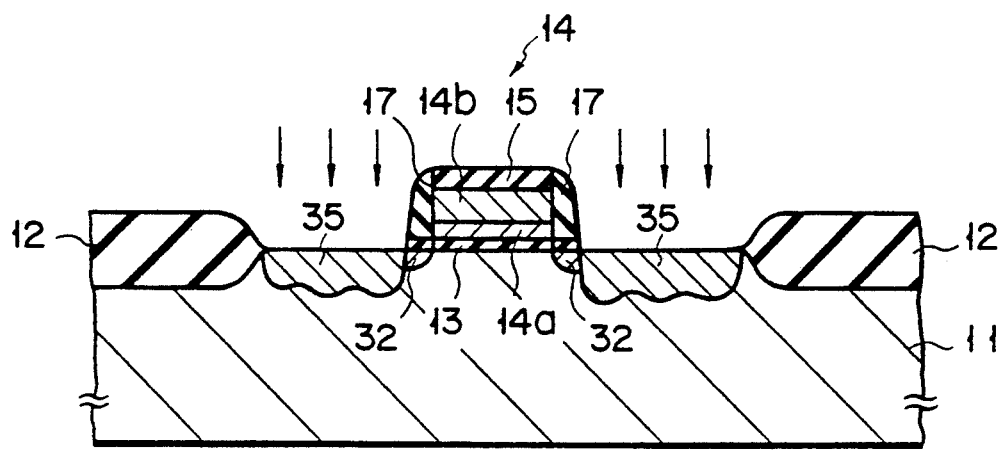

Then, boron ions are implanted into the layer 34 under the conditions of 10 keV of acceleration voltage and $1\times10^{16}$ cm$^{-2}$ of dosage, thereby to form an impurity doped PdSi layer 35 (FIG. 3E).

Subsequently, it is annealed at 650° C. for 60 minutes, to inversely phase transform the PdSi layer 35 of about 2000 Å thickness. As a result of the inverse phase transformation, a silicon layer 36 containing boron deposits on the substrate 11 and a Pd$_2$Si layer 37 is formed. To make the inverse phase transformation, preferable temperature is between 600° C. and 700° C. In this way, a p$^+$ source region 30a and a drain region 30b are formed. It is noted that the silicon layer 36 deposits with using the silicon substrate 11 as a seed, and hence the configuration and the depth of the bottom of the layer 36 are substantially equal to those of the PdSi layer 35. It is further noted that because of an irregularity of the interface between the silicon layer 36 and the Pd$_2$Si layer 37, a contact area between them is large and therefore resistance in the source/drain region is reduced. Careful observation of the irregularity of the interface by a microscope showed that the top-to-bottom distance was 100 Å or more.

Figure 3F:
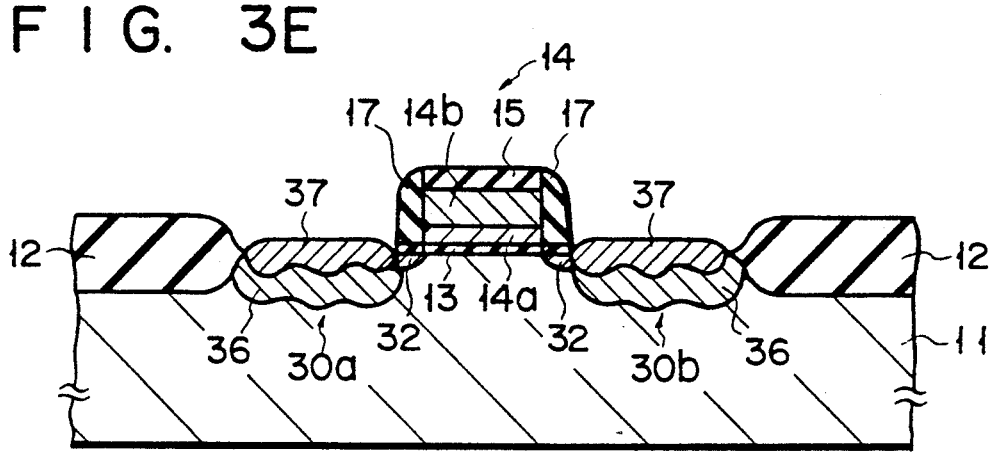

It is additionally noted that though the silicon layer 36 is formed in a shallow region in the substrate, the Pd$_2$Si layer is upheaved above the substrate, and therefore the sum of the thickness of the silicon layer and that of the Pd$_2$Si layer is large, leading to reduction of the resistance of the source/drain region (FIG. 3F).

Figure 3G:
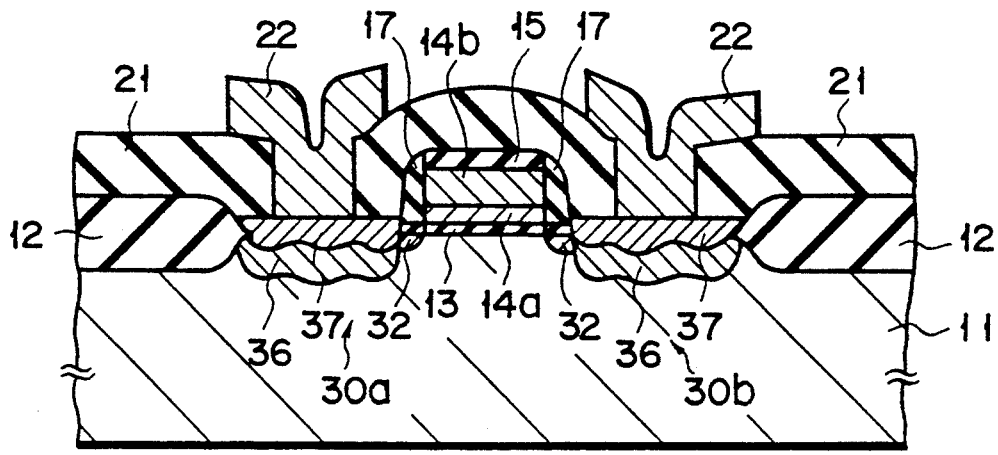

Finally, a SiO$_2$ film 21 as an interlayer insulating film is formed over the entire surface of the structure. The areas of the film 21 just above the source region 30a and the drain region 30b are opened. Within the openings, electrode wires 22 made of aluminum are formed connecting to the Pd$_2$Si layer 37, to complete MOS FETs (FIG. 3G).

The cross section of the MOS FETs thus manufactured were carefully observed by an electron microscope. The observation results were: depth of a medium concentration layer 32 was 500 Å; the region where the source/drain regions 30a and 30b were formed was shallow, of approximately 1000 Å depth as measured from the surface of the n-type substrate. In the FET thus structured, the drain current is allowed to flow in the shallow region of the silicon substrate 11. Accordingly, the drain current is readily controllable by a voltage applied to the gate electrode. With this, the mutual conductance of the FET of 0.5 μm gate length was remarkably improved, viz., it was 1800 mS/mm, while that of the conventional FET of the same gate length was 1000 mS/mm.

Figure 4:
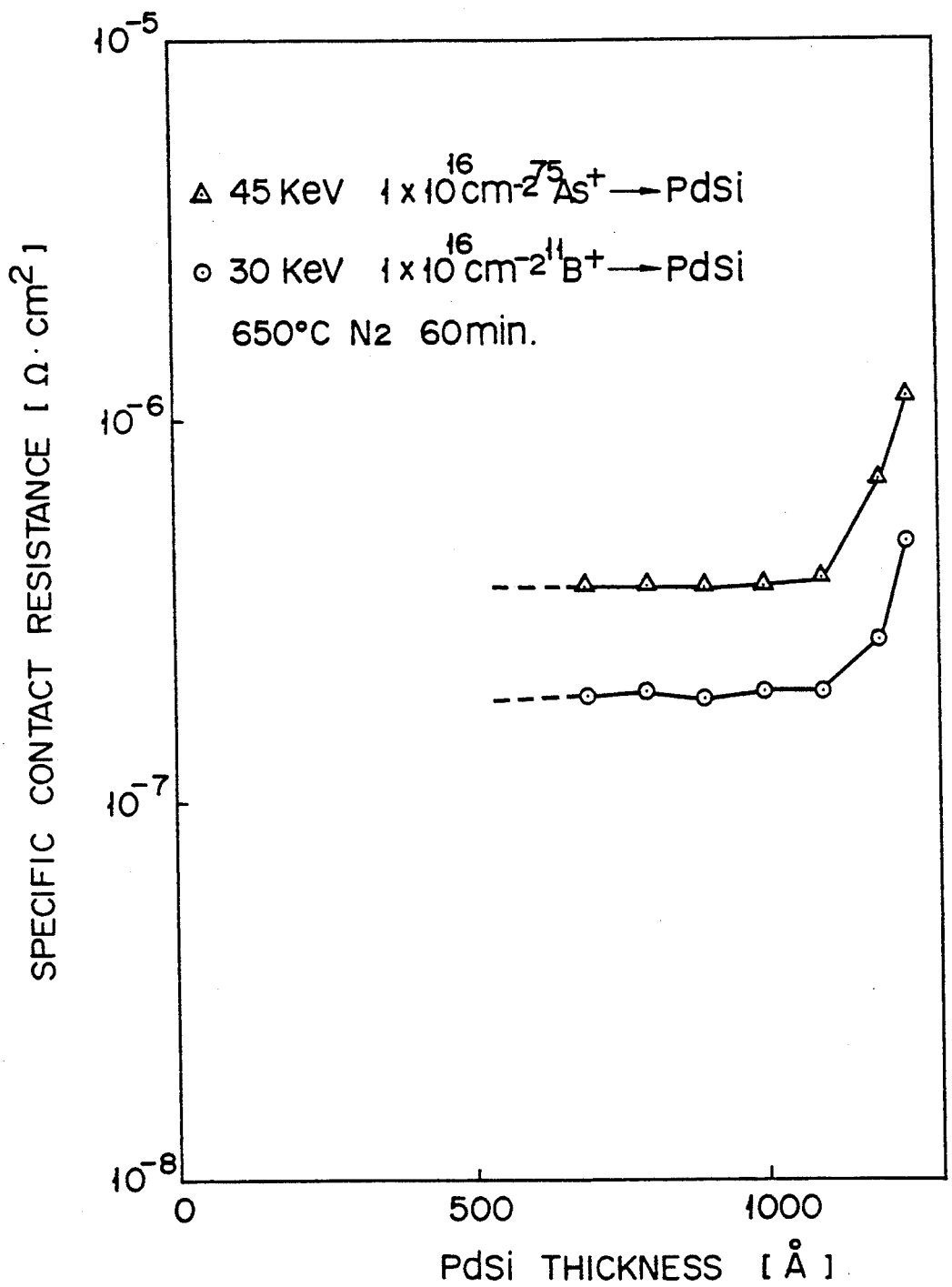
FIG. 4 is a graph showing a relationship between a thickness of PdSi layer and specific contact resistance.

In the stage where the source region 30a and the drain region 30b are formed with the silicon layer 36 and the Pd$_2$Si layer thereon by inversely phase transforming forming the Pd$_2$Si layer 35, variations of specific contact resistance of those regions against the thickness of the PdSi layer 35 were measured. The results of the measurement were plotted as shown in FIG. 4. In the graph, a curve connecting symbols of delta indicates a variation of the specific contact resistance of the regions against the thickness when, before the inverse phase transformation, arsenic ions were implanted into the PdSi layer under the conditions of 45 keV of acceleration voltage and $1\times10^{16}$ cm$^{-2}$ of dosage. Another curve connecting symbols of circle indicates a variation of the specific contact resistance of the regions against the thickness when, before the inverse phase transformation, boron ions were implanted into the PdSi layer under the conditions of 30 keV of acceleration voltage and $1\times10^{15}$ cm$^{-2}$ of dosage.

As seen from the graph, the specific contact resistance of the regions sharply increases when the thickness of the PdSi layer exceeds 1100 Å. Therefore, the thickness of the PdSi layer is preferably 1100 Å or less, to keep the specific contact resistance small.

In the embodiment as mentioned above, Pd is used as an inverse phase transformable material, but if required, any other suitable material than the Pd may be used, as a matter of course. Also in the embodiment, the phase transformation is employed to reform the alloy layer into the silicon rich film. To obtain the silicon rich film, the ion implantation of silicon into the alloy layer may also be used, together with the phase transformation.

A second embodiment of a semiconductor device according to the present invention will be described with reference to FIGS. 5A through 5C.

The second embodiment is different from the first embodiment in that another method is employed for reforming the metal silicide layer into a silicon rich film, and the inverse phase transformable material is Co, not Pd.

Through the process steps from FIGS. 3A to 3C, a CoSi$_2$ layer, in place of the PdSi layer, is formed. Cobalt is made to deposit by the DC magnetron sputtering method, to form a Co film of 300 Å thickness. To silicidize it, the structure is annealed at 650° C. for 10 minutes. The unreactive Co film is immersed in a mixed liquid of hydrogen peroxide and hydrochloric acid, to remove the unreactive Co film.

Then, silicon ions are implanted into the CoSi$_2$ layer under the conditions of 20 keV of acceleration voltage and $1\times10^{17}$ cm$^{-2}$ of dosage, thereby to form a cobalt silicide layer 54 of silicon rich (FIG. 5A).

Subsequently, boron ions are implanted into the cobalt silicide layer 54 under the conditions of 15 keV of acceleration voltage and $1\times10^{16}$ cm$^{-2}$ of dosage, thereby to form a boron-doped cobalt silicide layer 55. This process step may be followed by the implantation of the silicon ions (FIG. 5B).

In an Ar (argon) gas, the structure is annealed at 850° C. for one hour or annealed at 1000–1050° C. for 10–60 sec. Through the annealing process, a boron-doped silicon layer 56 deposits with silicon of the substrate 11 as a nucleus, while at the same time, a CoSi$_2$ layer 57 is formed. Consequently, a p+ source region 50a and a drain region 50b are formed. Those regions are formed in a shallow region of the substrate, as in the first embodiment (FIG. 5C).

Subsequently, electrode wirings are formed as in the step of FIG. 3G, to complete MOS FET. The MOS FET thus manufactured has excellent characteristics comparable with those of the MOS FET manufactured by the previous embodiment.

Figure 6A:
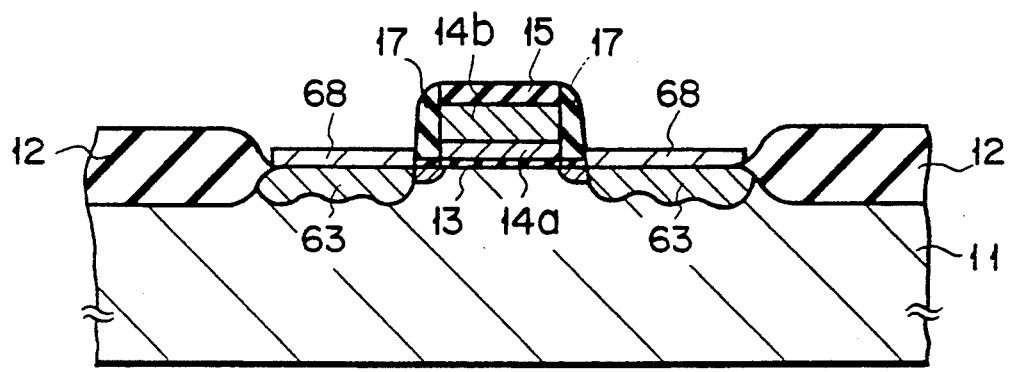
FIGS. 6A through 6C are sectional views showing a sequence of process steps to manufacture a semiconductor device according to a third embodiment of the present invention.

A third embodiment of a semiconductor device according to the present invention will be described with reference to FIGS. 6A through 6C.

This embodiment is different from the second embodiment in the process to transform the metal silicide layer into a silicon rich layer.

Through the process steps from FIGS. 3A to 3C, a $CoSi_2$ layer 63, in place of the PdSi layer, is formed. The same conditions as those of the second embodiment may be used for forming this layer.

Then, by using an LPCVD method, a silicon layer 68 of 300 Å thick is formed on the $CoSi_2$ layer 63 under the conditions that a partial pressure of silane is $5 \times 10^{-4}$ Torr, temperature 500° C. (FIG. 6A).

Figure 6B:
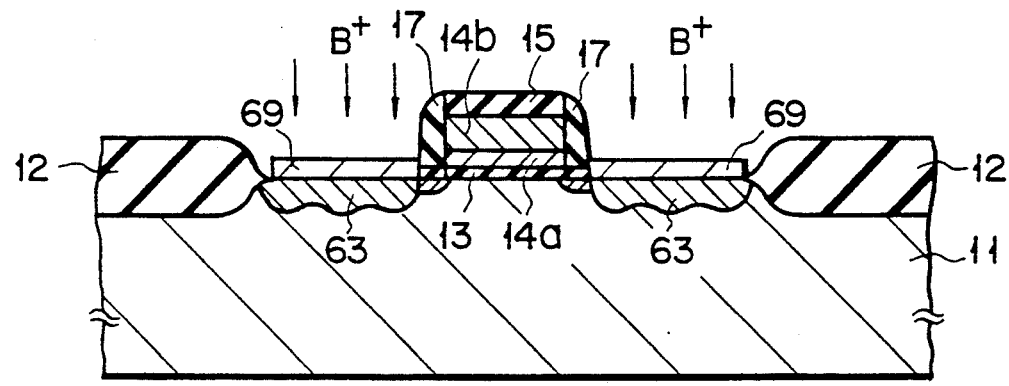
Figure 6C:
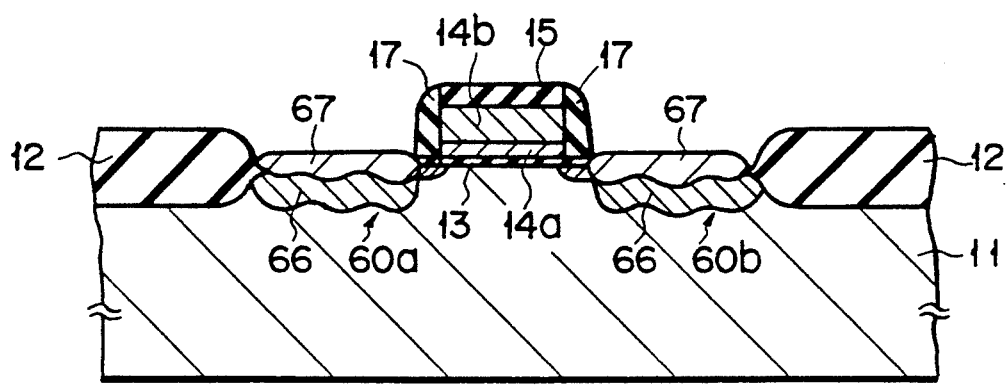

Subsequently, boron ions, for example, are implanted into the silicon layer 68 under the conditions of 20 keV of acceleration voltage and $1 \times 10^{15}$ cm$^{-2}$ of dosage (FIG. 6B).

In an Ar gas, the structure is annealed at 850° C. for one hour. Through the annealing process, the $CoSi_2$ layer 63 is temporarily rich in silicon. And excessive silicon deposits on the silicon substrate 11, to form a P type silicon layer 66 doped with boron at $1 \times 10^{20}$ cm$^{-3}$, and a $CoSi_2$ layer 67 is further formed on the layer 66 (FIG. 6C).

Then, the process steps to form the interlayer insulating film and electrode wiring are exercised, to complete P-channel MOS FET.

Also in this embodiment, the P type silicon layer 66 is formed in a shallow region, as in the previous embodiments. Therefore, it has excellent characteristics.

In the stage where the source/drain region is formed by causing the silicon layer to separate from the cobalt silicide layer, specific contact resistance of the cobalt silicide layer was measured against Si/Co ratios of the layer. The results of the measurement were as shown in FIG. 7A. In the graph, a curve connecting symbols of circle indicates a variation of the specific contact resistance of the cobalt silicide layer against the Si/Co ratios when BF2 ions were implanted into the cobalt silicide layer under the conditions of 40 keV of acceleration voltage and $1 \times 10^{16}$ cm$^{-2}$ of dosage. Another curve connecting symbols of delta indicates a variation of the specific contact resistance against the Si/Co ratios when arsenic ions were implanted into the cobalt silicide layer under the conditions of 50 keV of acceleration voltage and $1 \times 10^{16}$ cm$^{-2}$ of dosage. As seen from the graph, the specific contact resistance sharply increases for 2.5 or more of the Si/Co ratio. The graph teaches that to form the source/drain region of low resistance and located in a shallow region from the cobalt silicide layer of silicon rich, the Si/Co is preferably between 2 and 2.5.

Figure 7B:
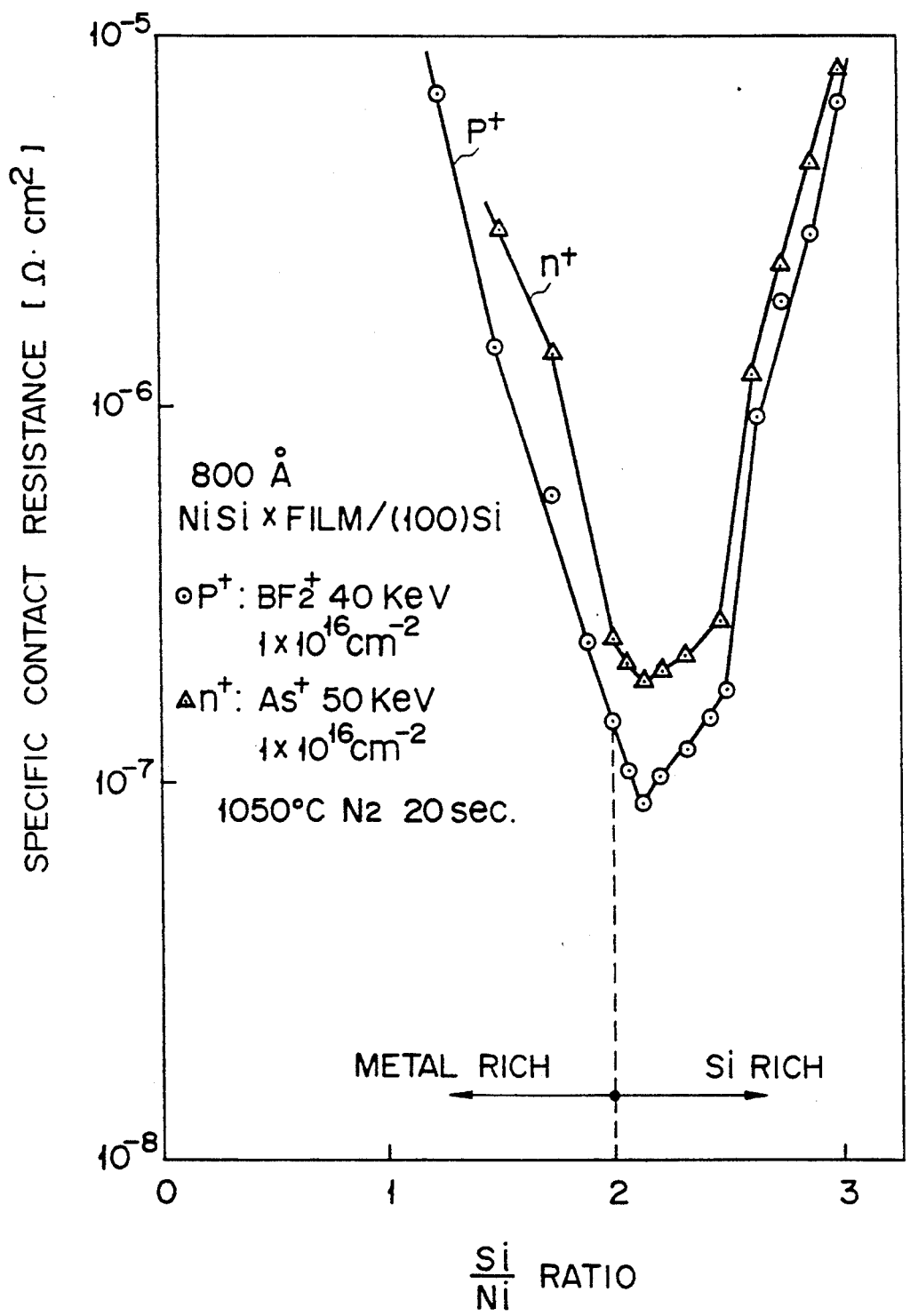

In the first to third embodiments, Ni (nickel) may be used in place of Pd and Co. FIG. 7B is a graph showing variations of specific contact resistance against composition ratios when a nickel silicide layer, in place of the cobalt silicide layer, is used for forming the MOS FET. As seen from the graph, also in the case of the nickel silicide of silicon rich, the Si/Ni is preferably between 2 and 2.5.

FIG. 8 is a sectional view showing a model of each of semiconductor devices according to fourth and fifth embodiments of the present invention.

As shown, in the semiconductor device in which an impurity diffusion layer 3 of the second conductivity type selectively formed in the surface region of a semiconductor substrate of the first conductivity type (for example, the impurity diffusion layer constitutes source and drain regions sandwiching a channel region), and an alloy layer 5 containing a composition of the substrate and a metal that is formed above the diffusion layer 3, a semiconductor layer 4 of the second conductivity type is interposed between the diffusion layer 3 and the alloy layer 5, whereby the lower surface of the alloy layer 5 is set to be higher than the surface of the substrate. In the figure, reference numeral 2 designates an element separation oxide film or an insulating film for interlayer insulation, for example.

The semiconductor device as just mentioned may be manufactured in the following manner. Firstly, the impurity diffusion layer 3 of the second conductivity type is formed in a part of the surface region of the semiconductor substrate of the first conductivity. Secondly, the semiconductor layer 4 is epitaxially grown (made to deposit in a broad sense) on the diffusion layer 3. Finally, the metal-semiconductor alloy layer 5 is formed on the semiconductor layer 4 in a selfalignment manner. In the formation of the layer 5, the semiconductor layer 4 is partially eaten.

FIGS. 9A through 9E are sectional views showing a sequence of process steps to manufacture a semiconductor device according to a fourth embodiment of the present invention.

To start with, a field oxide film 12 of 0.6 μm thickness is formed on an n-type silicon substrate 11 (semiconductor substrate of the first conductivity type) whose specific resistance is 4 to 5 ohms.cm and face orientation is set at <100>.

Figure 9A:
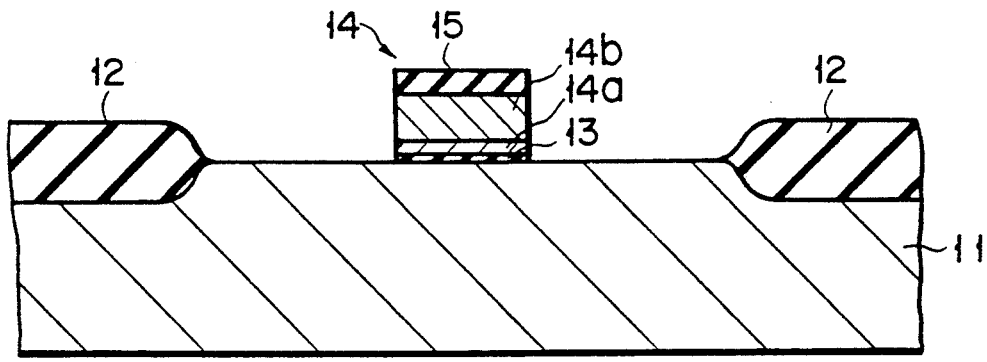
FIGS. 9A through 9E are sectional views showing a sequence of process steps to manufacture a semiconductor device according to a fourth embodiment of the present invention.

Within an element forming region of the substrate surrounded by this film 12, a gate oxide film 13 of 100 Å thickness, an As doped polycrystalline silicon layer 14a of 1000 Å thickness, and a tungsten silicide ($WSi_{2.5}$) film 14b of 3000 Å thickness are successively layered in this order, and a $SiO_2$ film 15 of 1500 Å thickness is further layered on top layer of the multilayered structure by an LPCVD method. Then, the laminated structure consisting of the layers 13 to 15 is shaped like a gate electrode by a reactive ion etching (RIE) process. The polycrystal silicon layer 14a and the tungsten silicide layer 14b make up a gate electrode 14 (FIG. 9A).

Figure 9B:
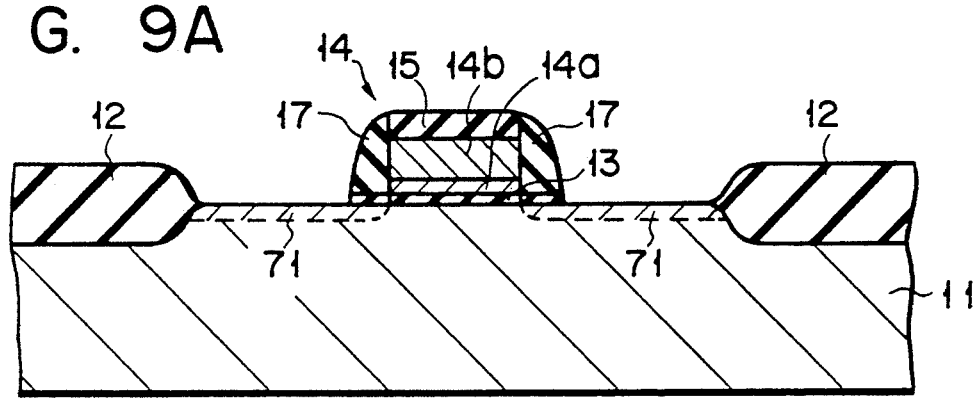

B+ ions are implanted into the substrate surface under the conditions of 2 keV of acceleration voltage and $5 \times 10^{13}$ cm$^{-2}$ of dosage. Then, the structure is annealed at 700° C. for 30 minutes, to form a p− layer 71 (impurity diffusion layer of the second conductivity type) of 0.1 μm depth. This layer 71 is to serve as the source/drain region. Then, a $SiO_2$ film 17 of 0.1 μm thickness is formed on the side wall of the gate electrode. To form the side wall oxide film 17, an $SiO_2$ film of 1500 Å is applied to the entire surface of the gate electrode, and then it is etch backed by an anisotropy dry etching method (FIG. 9B).

Figure 9C:
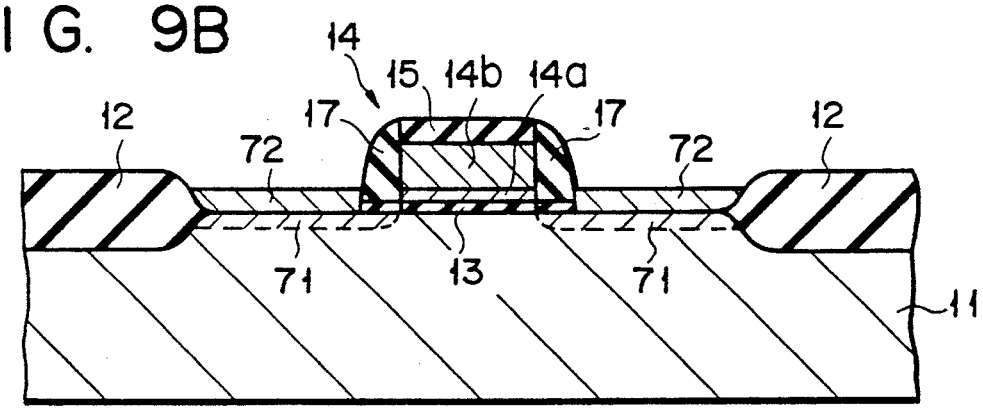

Subsequently, a monocrystal silicon layer (monocrystal semiconductor layer) 72 of 1200 Å thickness is epitaxially grown on the exposed surface of the substrate Si not covered with the insulating films 12, 15 and 17, that is, the p⁻ layer 71, by a CVD method. For this selective growth of Si, the structure is placed at 500° C. and 1 Pa. in an SiH₄ gas that is diluted by H₂ (FIG. 9C).

Figure 9D:
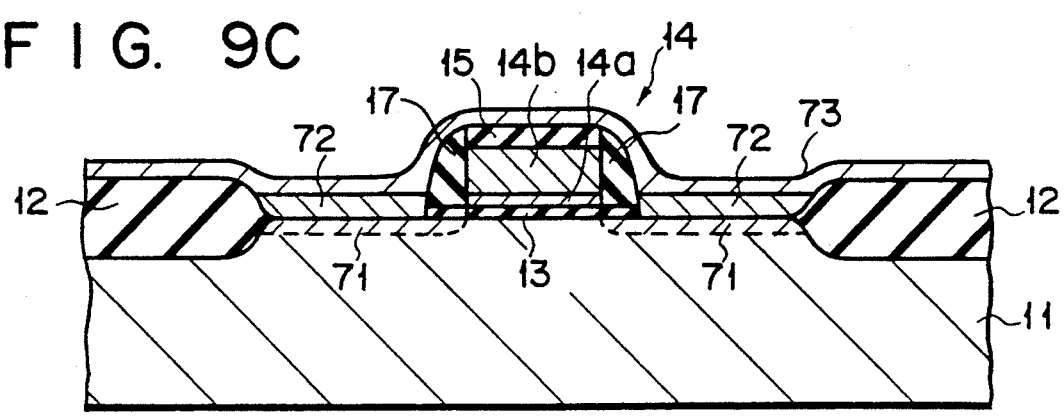
Figure 9E:
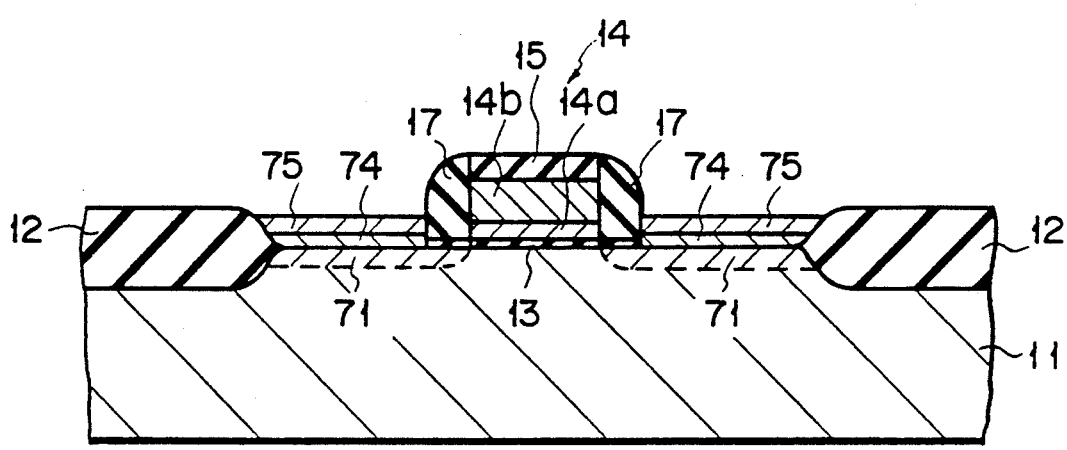

As shown in FIG. 9D, an Ni film 73 of 300 Å thick is vapor deposited over the entire surface of the structure. Then, the structure is annealed at 350° C. for 30 minutes in an Ar gas, and is again annealed at 850° C. for 10 minutes, thereby to form an NiSi₂ layer (metal-semiconductor alloy layer) 75 of 1000 Å, as shown in FIG. 9E. Then, the unreactive Ni film 73 is removed by a mixed solution of $H_2O_2 + HCl + H_2O$. To set the conductivity type of the Si layer 72 to the p⁺ type, B⁺ ions are implanted into the structure under the conditions of 10 keV of acceleration voltage and $1 \times 10^{15}$ cm⁻² or dosage. Then, the structure is annealed at 850° C. for 30 minutes.

In the MOS FET thus manufactured, the p⁻ layer 71 extends by 0.1 μm below the gate side wall. A p⁺ doped Si layer 74 of 200 Å thickness is formed under the NiSi₂ layer 75 of 1000 Å thickness, and the p⁻ layer 71 of 0.1 μm is formed under that layer. Of the MOS FETs thus manufactured, those up to 0.1 μm of channel length normally operated.

As seen from the foregoing description, in the fourth embodiment, the monocrystal Si layer 72 is formed on the p⁻ impurity diffusion layer 71. Then, those layers are alloyed into the NiSi₂ layer 75. Accordingly, the substrate Si will never be eroded by the silicide. Because of this, the p⁻ impurity diffusion layer 71 may be satisfactorily thin, and the NiSi₂ layer 75 may be relatively thick. Consequently, the resultant micro MOS FET with a shallow and low resistance source/drain region can be realized, contributing to the performance improvement of the transistor. For example, the short channel effect of the micro MOS FET is controlled to minimum. The resistance and the parasitic capacitance in the source/drain region are reduced. The process to manufacture such MOS FETs may readily be realized by additionally using only the step to form the monocrystal Si layer 72.

Figure 10A:
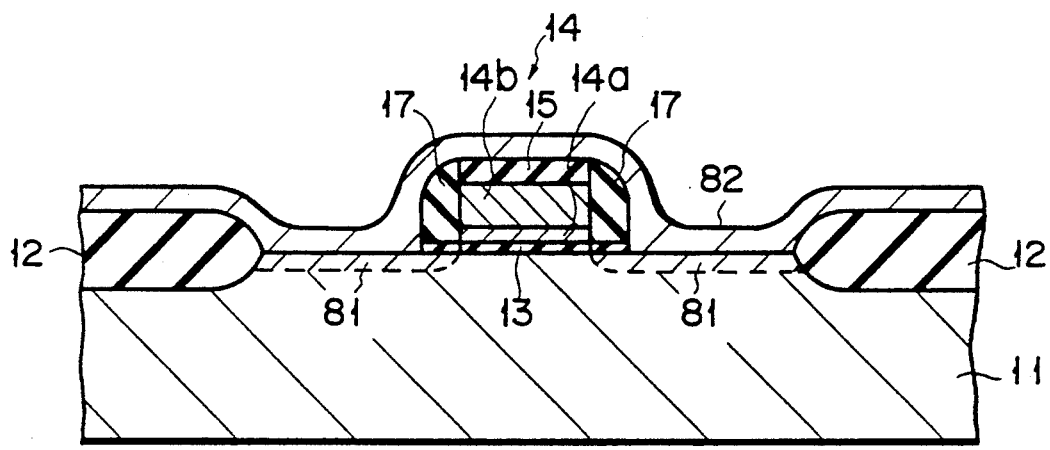
FIGS. 10A and 10B are sectional views showing process steps to manufacture a semiconductor device according to a fifth embodiment of the present invention.
Figure 10B:
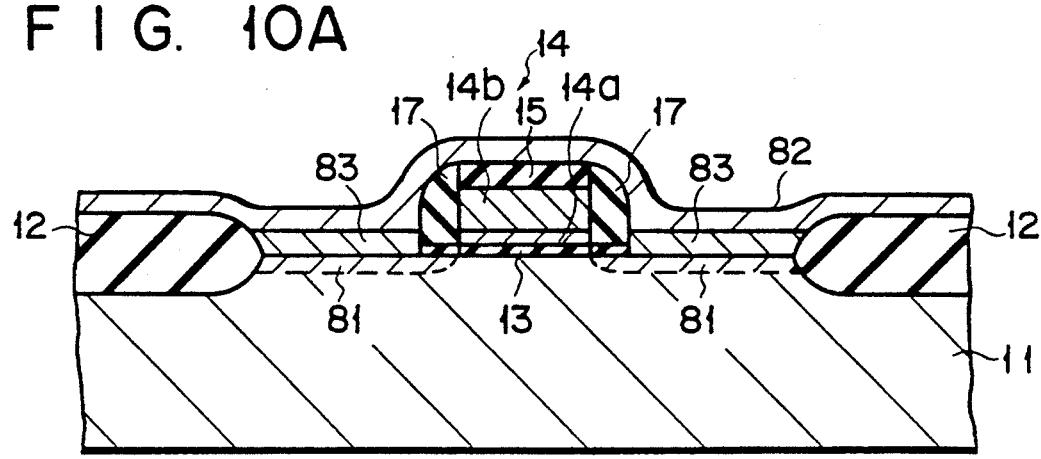

FIGS. 10A and 10B are sectional views showing process steps to manufacture a semiconductor device according to a fifth embodiment of the present invention.

The fifth embodiment is different from the fourth embodiment described above in a selectively growing method of the Si layer. In this embodiment, after an impurity diffusion layer 81 is formed by the process steps shown in FIGS. 9A and 9B, an Sn film 82 of 2000 Å is applied to the entire surface of the structure by evaporating process, as shown in FIG. 10A. Then, the structure is placed at 450° C. and 10 Pa. in an SiH4 gas, so that a monocrystal Si layer 83 of 1200 Å thickness is selectively grown only on the exposed Si surface under the Sn film 82. At this time, the Sn film 82 is in a melting state, because its melting point is low, 150 to 200° C. In the melting state, Si passes through the melted Sn and grows on the surface of the Si underlayer. It is evident that Sn may be replaced by an element of low melting point belonging to any of groups III, IV and V of Periodic Table.

Subsequently, after the Sn film 82 is removed, as in the previous embodiment, the process steps for the silicide formation and the source/drain region formation, as shown in FIGS. 9C through 9E, follow. As a result, the MOS FET is completed. The structure after the Sn film 82 is removed resembles that shown in FIG. 9C. Accordingly, the resultant MOS FET has a shallow and low resistance source/drain region, like the previous embodiment.

It is evident that the fourth and the fifth embodiments may be variously modified and changed. The metal film formed on the monocrystal semiconductor layer may be made of any metal that can be silicidized, although it is made of Ni in the embodiments. In the embodiments, the p⁺ layer and the p⁻ layer that are laid under the silicide alloy layer, are 200 Å and 1000 Å, respectively. In the case of the p⁺/n or n⁺/p junction of about 0.1 μm or less, the lower surface of the alloy layer is preferably flat. For this reason, the silicide to be formed is preferably a silicide that can be epitaxially grown, such as NiSi₂, CoSi₂, Pd₂Si, and PtSi. In the embodiments, after the monocrystal semiconductor layer is formed, it is converted into the layer of the second conductivity by the ion implantation method. Alternatively, impurity may be previously doped into the semiconductor layer for the same purpose.

In the fourth and the fifth embodiments, the monocrystal semiconductor layer is formed on the impurity diffusion layer, this semiconductor layer alloyed with a metal into the silicide alloy layer. Therefore, the alloy layer can be formed without eroding the the surface of the semiconductor substrate. This leads to the formation of a shallow and low resistance impurity layer. This results in minimization of the short channel effect of the resultant micro MOS FET, and reduction of resistance and parasitic capacitance in the source/drain region of the transistor.

While some specific embodiments of the present invention have been described, it should be understood that the invention may be variously changed and modified within the scope of the invention.

For instance, an Si-rich metal silicide film can be formed directly on the Si substrate by means of LPCVD. The LPCVD is performed under the following conditions, when the film is made of cobalt silicide:

Source gases are $CO_2(CO)_8$ (0.01–10 sccm) and SiH₄ (0.1–10 sccm). Carrier gas is H₂ (10–100 sccm) diluted with Ar (10–100 sccm). Substrate temperature is 200–400° C. and total pressure is 1–100 Pa.

The composition of the CoSix film formed on the Si exposed region is $CoSi_{2.1}$—$CoSi_{2.5}$. The thickness of the CoSix film is 100–2000 Å.

boron ions or arsenic ions are then implanted into the substrate with the $CoSi_{2.1-2.5}$ film formed thereon, and then the structure is heat-treated under the conditions similar to those in the embodiments described above.

Instead of cobalt silicide film, nickel silicide film, tungsten silicide film, and the like can be used.

Furthermore, the present invention is applicable for other types of FETs with different electrode structure, such as Schottky junction type FET and MIS FET, in addition to the MOS FET. The present invention is applicable to any other component requiring a shallow diffusion layer than the FET, such as a pn junction diode and a bipolar transistor. The invention is applicable for the connection of a diffusion layer and a wiring layer of a contact hole. The material of the substrate that is Si in the embodiments mentioned above, may be any of Ge, GaAs, InP and the like.

What is claimed is:

1. A method of manufacturing on a silicon substrate of a first conductivity type, a field effect transistor having at each of source/drain regions a silicon layer containing an impurity of a second conductivity type, and a metal silicide layer on said silicon layer, the metal of said metal silicide layer being a metal which forms a compound with silicon, the method comprising:
  a) forming a field insulation film on said substrate;
  b) forming a gate electrode on said substrate in between the source/drain regions;
  c) forming insulating films on the side walls of said gate electrode;
  d) forming at each of said source/drain regions on alloy layer made of said metal and silicon on an exposed surface of said substrate, said alloy layer being richer in silicon than said metal silicide layer and containing said impurity of the second conductivity type; and
  e) heating said alloy layer to precipitate therefrom said silicon layer containing said impurity of the second conductivity type and thus transforming said alloy layer into said metal silicide layer at each of said source/drain regions.

2. The method according to claim 1, wherein said step of forming said alloy layer comprises:
  i) forming a first compound layer made of said metal and silicon at each of said source/drain regions; and
  ii) thermally diffusing silicon from said substrate into said first compound layer to form said alloy layer of said first compound layer.

3. The method according to claim 2, wherein said impurity containing said alloy layer is ion-implanted into said alloy layer after said alloy layer is made rich in silicon.

4. The method according to claim 3, wherein said steps of forming and heating said alloy layer comprise:
  i) forming said first compound layer on each of said source/drain regions, said first compound layer having the same compound composition as that of said metal silicide layer;
  ii) heating said first compound layer on said substrate at a first temperature, thereby diffusing silicon from sad substrate into said first compound layer to transform said first compound layer into a second compound layer, which substantially constitutes said alloy layer;
  iii) ion-implanting said impurity into said second compound layer; and
  iv) heating said second compound layer at a second temperature, to precipitate said silicon layer from said second compound layer and transform said second compound layer into said metal silicide layer.

5. The method according to claim 4, wherein said metal is Pd, said first compound layer is $Pd_2Si$, said second compound layer is PdSi, said first temperature is 730° C. or more, and said second temperature is 600–700° C.

6. The method according to claim 4, wherein said step of forming said first compound layer, comprises:
  i) forming a metal layer made of said metal on each of said source/drain regions; and
  ii) heating said metal layer on said substrate to transform said metal layer into said first compound layer.

7. A method of manufacturing on a silicon substrate of a first conductivity type, a field effect transistor having at each of source/drain regions a silicon layer containing an impurity of a second conductivity type, and a metal silicide layer on a silicon layer, the metal of said metal silicide layer being a metal which forms a compound with silicon, the method comprising:
  a) forming a field insulation film on said substrate;
  b) forming a gate electrode on said substrate in between the source/drain regions;
  c) forming insulating films on the side walls of said gate electrode;
  d) forming at each of said source/drain regions on alloy layer made of said metal and silicon on an exposed surface of said substrate, said alloy layer being richer in silicon than said metal silicide layer and containing said impurity of the second conductivity type; and
  e) heating said alloy layer to precipitate therefrom said silicon layer containing said impurity of the second conductivity type and thus transforming said alloy layer into said metal silicide layer at each of said source/drain regions, and wherein said step of forming said alloy layer, comprises:
    i) forming a compound layer made of said metal and silicon on each of said source/drain regions; and
    ii) ion-implanting silicon into said compound layer to form said alloy layer from said compound layer.

8. The method according to claim 7, wherein said impurity contained in said alloy layer is ion-implanted into said alloy layer after said alloy layer is made rich in silicon.

9. The method according to claim 8, wherein said step of forming said compound layer, comprises:
  i) forming a metal layer made of said metal on each of said source/drain regions; and
  ii) heating said metal layer on said substrate to transform said metal layer into said first compound layer.

10. The method according to claim 9, wherein said metal layer is Co or Ni.

11. A method of manufacturing on a silicon substrate of a first conductivity type, a field effect transistor having at each of source/drain regions a silicon layer containing an impurity of a second conductivity type, and a metal silicide layer on said silicon layer, the metal of said metal silicide layer being a metal which forms a compound with silicon, the method comprising:
  a) forming a field insulation film on said substrate;
  b) forming a gate electrode on said substrate in between the source/drain regions;
  c) forming insulating films on the side walls of said gate electrode;
  d) forming at each of said source/drain regions on alloy layer made of said metal and silicon on an exposed surface of said substrate, said alloy layer being richer in silicon than said metal silicide layer and containing said impurity of the second conductivity type; and
  e) heating said alloy layer to precipitate therefrom said silicon layer containing said impurity of the second conductivity type and thus transforming said alloy layer into said metal silicide layer at each of said source/drain regions, and wherein said step of forming said alloy layer, comprises:
    i) forming a compound layer made of said metal and silicon on each of said source/drain regions;
    ii) forming another silicon layer on said compound layer; and
    iii) heating said other silicon layer on said compound layer, thereby thermally diffusing silicon from said other silicon layer into said compound layer to form said alloy layer from said compound layer.

12. The method according to claim 11, wherein said impurity contained in said alloy layer is ion-implanted into said other silicon layer before said ally layer is made rich in silicon.

13. The method according to claim 12, wherein said thermal diffusion of silicon into said compound layer to form said alloy layer, said precipitation of said silicon layer from said alloy layer, and said transformation of said alloy layer into said metal silicide layer are performed by means of heat treatment.

14. The method according to claim 13, wherein said step of forming said compound layer, comprises:
  i) forming a metal layer made of said metal at each of said source/drain regions; and
  ii) heating said metal layer on said substrate to transform said metal layer into said compound layer.

15. The method according to claim 14, wherein said metal is Co or Ni.

* * * * *